United States Patent [19]
Bolt et al.

[11] Patent Number: 4,983,573
[45] Date of Patent: Jan. 8, 1991

[54] PROCESS FOR MAKING 90° K. SUPERCONDUCTORS BY IMPREGNATING CELLULOSIC ARTICLE WITH PRECURSOR SOLUTION

[75] Inventors: John D. Bolt, Landenberg, Pa.; Munirpallam A. Subramanian, New Castle, Del.

[73] Assignee: E. I. Du Pont de Nemours and Company, Wilmington, Del.

[21] Appl. No.: 323,366

[22] Filed: Mar. 13, 1989

Related U.S. Application Data

[62] Division of Ser. No. 60,079, Jun. 9, 1987.

[51] Int. Cl.$^5$ .................. H01L 39/12; B05D 5/12; B05D 1/18
[52] U.S. Cl. ................... 505/1; 505/734; 505/737; 505/739; 505/740; 427/62; 427/121; 427/226; 427/227; 427/430.1; 427/439; 264/29.4; 264/29.6; 264/44; 264/62
[58] Field of Search .............. 427/62, 63, 121, 226, 427/227, 430.1, 439; 505/1, 734, 737, 739, 740; 264/104, 29.4, 29.6, 44, 60, 61, 62, 29.2

[56] References Cited

U.S. PATENT DOCUMENTS 4,883,619 11/1989 Diederich et al. ............ 264/60

OTHER PUBLICATIONS

Uchida et al., *Jap. J. of Applied Phys. Lett.*, 1 Jan. 1987, pp. L1–L2.
Rice et al., *Applied Physics Letters*, 30 Nov. 1987, pp. 1842–1844.

*Primary Examiner*—Shrive Beck
*Assistant Examiner*—Margaret Bueker

[57] ABSTRACT

There is disclosed an improved process for preparing a superconducting composition having the formula $MBa_2Cu_3O_x$ wherein M is selected from the group consisting of Y, Nd, Sm, Eu, Gd, Dy, Ho, Er, Tn, Yb and Lu; x is from about 6.5 to about 7.0; said composition having a superconducting transition temperature of about 90° K.; said process consisting essentially of preparing a precursor solution, drying the solution to obtain a solid material, and heating and cooling the solid material under specified conditions to obtain the desired product. In another embodiment, a shaped superconducting $MBa_2Cu_3O_x$ article is prepared by impregnating an article of cellulose material with the precursor solution, drying the impregnated article, and heating and cooling the impregnated article under prescribed conditions to obtain the desired product.

8 Claims, No Drawings

PROCESS FOR MAKING 90° K. SUPERCONDUCTORS BY IMPREGNATING CELLULOSIC ARTICLE WITH PRECURSOR SOLUTION

This is a division of application Ser. No. 07/060,079, filed June 9, 1987.

BACKGROUND OF THE INVENTION

1. Field of the Invention

This invention relates to an improved process for making rare earth-barium-copper oxide superconductors with transition temperatures above 90 K.

2. Description of Related Art

Bednorz and Muller, *Z. Phys.* B64, 189-193 (1986), disclose a superconducting phase in the La—Ba—Cu—O system with a superconducting transition temperature of about 35 K. Samples were prepared by a coprecipitation method from aqueous solutions of Ba—, La— and Cu—nitrate in their appropriate ratios. An aqueous solution of oxalic acid was used as the precipitant.

Chu et al., *Phys. Rev. Lett.* 58, 405-407 (1987), report detection of an apparent superconducting transition with an onset temperature above 40 K. under pressure in the La—Ba—Cu—O compound system synthesized directly from a solid-state reaction of $La_2O_3$, CuO and $BaCO_3$ followed by a decomposition of the mixture in a reduced atmosphere. Chu et al., *Science* 235, 567-569 (1987), disclose that a superconducting transition with an onset temperature of 52.5 K. has been observed under hydrostatic pressure in compounds with nominal compositions given by $(La_{0.9}Ba_{0.1})_2CuO_{4-y}$, where y is undetermined. They state that the $K_2NiF_4$ layer structure has been proposed to be responsible for the high-temperature superconductivity in the La—Ba—Cu—O system (LBCO). They further state that, however, the small diamagnetic signal, in contrast to the presence of up to 100% $K_2NiF_4$ phase in their samples, raises a question about the exact location of superconductivity in LBCO.

Cava et al., *Phys. Rev. Lett.* 58, 408-410 (1987), disclose bulk superconductivity at 36K. in $La_{1.8}Sr_{0.2}CuO_4$ prepared from appropriate mixtures of high purity La-$(OH)_3$, $SrCO_3$ and CuO powders, heated for several days in air at 1000° C. in quartz crucibles. Rao et al., *Current Science* 56, 47-49 (1987), discuss superconducting properties of compositions which include $La_{1.8}Sr_{0.2}CuO_4$, $La_{1.85}Ba_{0.15}CuO_4$, $La_{1.8}Sr_{0.1}$ CuO-hd 4, $(La_{1-x}Pr_x)_2$-$_ySr_yCuO_4$, and $(La_{1.75}Eu_{0.25})Sr_{0.2}CuO_4$. Bednorz et al., *Europhys. Lett.* 3, 379-384 (1987), report that susceptibility measurements support high-$T_c$ superconductivity in the Ba—La—Cu—O system. In general, in the La—Ba—Cu—O system, the superconducting phase has been identified as the composition $La_{1-x}(Ba,Sr,Ca)_xO_{4-y}$ with the tetragonal $K_2NiF_4$-type structure and with x typically about 0.15 and y indicating oxygen vacancies.

Wu et al., *Phys. Rev Lett.* 58, 908-910 (1987), disclose a superconducting phase in the Y—Ba—Cu—O system with a superconducting transition temperature between 80 and 93 K. The compounds investigated were prepared with nominal composition $(Y_{1-x}Ba_x)_2CuO_{4-y}$ and x=0.4 by a solid-state reaction of appropriate amounts of $Y_2O_3$, $BaCO_3$ and CuO in a manner similar to that described in Chu et al., *Phys. Rev. Lett.* 58, 405-407 (1987). Said reaction method comprises more specifically heating the oxides in a reduced oxygen atmosphere of $2 \times 10^{-5}$ bars (2 Pa) at 900° C. for 6 hours. The reacted mixture was pulverized and the heating step was repeated. The thoroughly reacted mixture was then pressed into 3/16 inch (0.5 cm) diameter cylinders for final sintering at 925° C. for 24 hours in the same reduced oxygen atmosphere. The material prepared showed the existence of multiple phases.

Hor et al., *Phys. Rev. Lett.* 58, 911-912 (1987), disclose that pressure has only a slight effect on the superconducting transition temperature of the Y—Ba—Cu—O superconductors described by Wu et al., supra.

Sun et al., *Phys. Rev. Lett.* 58, 1574-1576 (1987), disclose the results of a study of Y—Ba—Cu—O samples exhibiting superconductivity with transition temperatures in the 90 K. range. The samples were prepared from mixtures of high-purity $Y_2O_3$, $BaCO_3$ and CuO powders. The powders were premixed in methanol or water and subsequently heated to 100° C. to evaporate the solvent. Two thermal heat treatments were used. In the first, the samples were heated in Pt crucibles for 6 hours in air at 850° C. and then for another 6 hours at 1000° C. After the first firing, the samples were a dark-green powder, and after the second firing, they became a very porous, black solid. In the second method, the powders were heated for 8-10 hours at 1000° C., ground and then cold pressed to form disks of about 1 cm diameter and 0.2 cm thickness. The superconducting properties of samples prepared in these two ways were similar. X-ray diffraction examination of the samples revealed the existence of multiple phases.

Cava et al., *Phys. Rev. Lett.* 58, 1676-1679 (1987), have identified this superconducting Y—Ba—Cu13 O phase to be orthorhombic, distorted, oxygen-deficient perovskite $YBa_2Cu_3O_{9-\delta}$ where $\delta$ is about 2.1, and have presented the X-ray diffraction powder pattern and lattice parameters for the phase. The single-phase $YBa_2Cu_3O_{9-\delta}$ was prepared in the following manner. $BaCO_3$, $Y_2O_3$ and CuO were mixed, ground and then heated at 950° C. in air for 1 day. The material was then pressed into pellets, sintered in flowing $O_2$ for 16 hours and cooled to 200° C. in $O_2$ before removal from the furnace. Additional overnight treatment in $O_2$ at 700° C. was found to improve the observed properties.

Takita et al., *Jpn. J. Appl. Phys.* 26, L506-L507 (1987), disclose the preparation of several Y—Ba—Cu compositions with superconducting transitions around 90 K. by a solid-state reaction method in which a mixture of $Y_2O_3$, CuO, and $BaCO_3$ was heated in an oxygen atmosphere at 950° C. for more than 3 hours. The reacted mixture was pressed into 10 mm diameter disks for final sintering at 950° or 1000° C. for about 3 hours in the same oxygen atmosphere.

Takabatake et al., *Jpn. J. Appl. Phys.* 26, L502-L503 (1987), disclose the preparation of samples of $Ba_{1-x}Y_xCuO_{3-z}$ (x×0.1, 0.2, 0.25, 0.3, 0.4, 0.5, 0.6, 0.8 and 0.9) from the appropriate mixtures of $BaCO_3$, $Y_2O_3$ and CuO. The mixture was pressed into a disc and sintered at 900° C. for 15 hours in air. The sample with x×0.4 exhibited the sharpest superconducting transition with an onset near 96 K.

Syono et al., *Jpn. J. Appl. Phys.* 26, L498-L501 (1987), disclose the preparation of samples of superconducting $Y_{0.4}Ba_{0.6}CuO_{2.22}$ with $T_c$ higher than 88 K. by firing mixtures of 4N $Y_2O_3$, 3N $BaCO_3$ and 3N CuO in the desired proportions. The mixtures were prefired at 1000° C. for 5 hours. They were ground, pelletized and sintered at 900° C. for 15 hours in air and cooled to room temperature in the furnace. They also disclose that almost equivalent results were also obtained by starting from concentrated nitrate solution of 4N $Y_2O_3$, GR grade $Ba(NO_3)_2$ and $Cu(NO_3)_2$.

Takayama-Muromachi et al., *Jpn. J. Appl. Phys.* 26, L476–L478 (1987), disclose the preparation of a series of samples to try to identify the superconducting phase in the Y—Ba—Cu—O system. Appropriate amounts of $Y_2O_3$, $BaCO_3$ and CuO were mixed in an agate mortar and then fired at 1173±2 K. for 48–72 hours with intermediate grindings. X-ray diffraction powder patterns were obtained. The suggested composition of the superconducting compound is $Y_{1-x}Ba_xCuO_y$ where $0.6 < X < 0.7$.

Hosoya et al., *Jpn. J. Appl. Phys.* 26, L456–L457 (1987), disclose the preparation of various superconductor compositions in the L—Ba—Cu—O systems where L=Tm, Er, Ho, Dy, Eu and Lu. Mixtures of the proper amounts of the lanthanide oxide (99.9% pure), CuO and $BaCO_3$ were heated in air. The obtained powder specimens were reground, pressed into pellets and heated again.

Hirabayashi et al., *Jpn. J. Appl. Phys.* 26, L454–L455 (1987), disclose the preparation of superconductor samples of nominal composition $Y_3Ba_3CuO_{3-x}$ by coprecipitation from aqueous nitrate solution. Oxalic acid was used as the precipitant and insoluble Ba, Y and Cu compounds were formed at a constant pH of 6.8. The decomposition of the precipitate and the solid-state reaction were performed by firing in air at 900° C. for 2 hours. The fired products were pulverized, cold-pressed into pellets and then sintered in air at 900° C. for 5 hours. The authors found that the sample was of nearly single phase having the formula $Y_1Ba_2Cu_3O_7$. The diffraction pattern was obtained and indexed as having tetragonal symmetry.

Ekino et al., *Jpn. J. Appl. Phys.* 26, L452–L453 (1987), disclose the preparation of a superconductor sample with nominal composition $Y_{1.1}Ba_{0.9}CuO_{4-y}$. A prescribed amount of powders of $Y_2O_3$, $BaCO_3$ and CuO was mixed for about an hour, pressed under 6.4 ton/cm² (14 MPa) into pellet shape and sintered at 1000° C. in air for 3 hours.

Akimitsu et al., *Jpn. J. Appl. Phys.* 26, L449–L451 (1987), disclose the preparation of samples with nominal compositions represented by $(Y_{1-x}Ba_x)_2CuO_{4-y}$. The specimens were prepared by mixing the appropriate amounts of powders of $Y_2O_3$, $BaCO_3$ and CuO. The resulting mixture was pressed and heated in air at 1000° C. for 3 hours. Some samples were annealed at appropriate temperatures in $O_2$ or $CO_2$ for several hours. The authors noted that there seemed to be a tendency that samples annealed in $O_2$ showed a superconducting transition with a higher onset temperature but a broader transition than non-annealed samples.

Semba et al, *Jpn. J. Appl. Phys.* 26, L429–L431 (1987), disclose the preparation of samples of $Y_xBa_{1-x}CuO_{4-d}$ where x=0.4 and x=0.5 by the solid state reaction of $BaCO_3$, $Y_2O_3$ and CuO. The mixtures are heated to 950° C. for several hours, pulverized, and then pressed into disk shape. This is followed by the final heat treatment at 1100° C. in one atmosphere $O_2$ gas for 5 hours. The authors identified the phase that exhibited superconductivity above 90 K. as one that was black with the atomic ratio of Y:Ba:Cu of 1:2:3. The diffraction pattern was obtained and indexed as having tetragonal symmetry.

Hatano et al., *Jpn. J. Appl. Phys.* 26, L374–L376 (1987), disclose the preparation of the superconductor compound $Ba_{0.7}Y_{0.3}Cu_1O_x$ from the appropriate mixture of $BaCO_3$ (purity 99.9%), $Y_2O_3$ (99.99%) and CuO (99.9%). The mixture was calcined in an alumina boat heated at 1000° C. for 10 hours in a flowing oxygen atmosphere. The color of the resulting well-sintered block was black.

Hikami et al., *Jpn. J. Appl. Phys.* 26, L347–L348 (1987), disclose the preparation of a Ho—Ba—Cu oxide, exhibiting the onset of superconductivity at 93 K. and the resistance vanishing below 76 K., by heating a mixture of powders $Ho_2O_3$, $BaCO_3$ and CuO with the composition Ho:Ba:Cu=0.246:0.336:1 at 850° C. in air for two hours. The sample was then pressed into a rectangular shape and sintered at 800° C. for one hour. The sample looked black, but a small part was green.

Matsushita et al., *Jpn. J. Appl. Phys.* 26, L332–L333 (1987), disclose the preparation of $Ba_{0.5}Y_{0.5}Cu_1O_x$ by mixing appropriate amounts of $BaCO_3$ (purity 99.9%), $Y_2O_3$ (99.99%) and CuO (99.9%). The mixture was calcined at 1000° C. for 11 hours in a flowing oxygen atmosphere. The resultant mixture was then pulverized and cold-pressed into disks. The disks were sintered at 900° C. for 4 hours in the same oxygen atmosphere. The calcined powder and disks were black. A superconducting onset temperature of 100 K. was observed Maeno et al., *Jpn. J. Appl Phys.* 26, L329–L331 (1987), disclose the preparation of various Y—Ba—Cu oxides by mixing powders of $Y_2O_3$, $BaCO_3$ and CuO, all 99.99% pure, with a pestle and mortar. The powders were pressed at 100 kgf/cm² (98×10⁴ Pa) for 10–15 minutes to form pellets with a diameter of 12 mm. The pellets were black. The heat treatment was performed in two steps in air. First, the pellets were heated in a horizontal, tubular furnace at 800° C. for 12 hours before the heater was turned off to cool the pellets in the furnace. The pellets were taken out of the furnace at about 200° C. About half the samples around the center of the furnace turned green in color, while others away from the center remained black. The strong correlation with location suggested to the authors that this reaction occurs critically at about 800° C. The pellets were then heated at 1200° C. for 3 hours and then allowed to cool. Pellets which turned light green during the first heat treatment became very hard solids whereas pellets which remained black in the first heat treatment slightly melted or melted down. Three of the samples exhibited an onset of superconductivity above 90 K.

Iguchi et al., *Jpn. J. Appl. Phys.* 26, L327–L328 (1987), disclose the preparation of superconducting $Y_{0.8}Ba_{1.2}CuO_y$ by sintering a stoichiometrical mixture of $Y_2O_3$, $BaCO_3$ and CuO at 900° C. and at 1000° C. in air.

Hosoya et al., *Jpn. J. Appl. Phys.* 26, L325–L326 (1987), disclose the preparation of various superconducting specimens of the L—M—Cu—O systems where L=Yb, Lu, Y, La, Ho and Dy and M=Ba and a mixture of Ba and Sr by heating the mixtures of appropriate amounts of the oxides of the rare earth elements (99.9% pure), CuO, $SrCO_3$ and/or $BaCO_3$ in air at about 900° C. Green powder was obtained. The powder samples were pressed to form pellets which were heated in air until the color became black.

Takagi et al., *Jpn. J. Appl. Phys.* 26, L320–L321 (1987), disclose the preparation of various Y—Ba—Cu oxides by reacting mixtures containing the prescribed amounts of powders of $Y_2O_3$, $BaCO_3$ and CuO at 1000° C., remixing and heat-treating at 1100° C. for a few to several hours. An onset temperature of superconductivity at 95 K. or higher was observed for a specimen with the nominal composition of $(Y_{0.9}Ba_{0.1})CuO_y$.

Hikami et al., *Jpn. J. Appl. Phys.* 26, L314–L315 (1987), disclose the preparation of compositions in the Y—Ba—Cu—O system by heating the powders of $Y_2O_3$, $BaCO_3$ and CuO to 800° C. or 900° C. in air for 2–4 hours, pressing into pellets at 4 kbars ($4 \times 10_5$ Pa) and reheating to 800° C. in air for 2 hours for sintering. The samples show an onset of superconductivity at 85 K. and a vanishing resistance at 45 K.

Bourne et al., *Phys Letters A* 120, 494–496 (1987), disclose the preparation of Y—Ba—Cu—O samples of $Y_{2-x}Ba_xCuO_4$ by pressing finely ground powders of $Y_2O_3$, $BaCO_3$ and CuO into pellets and sintering the pellets in an oxygen atmosphere at 1082° C. Superconductivity for samples having x equal to about 0.8 was reported.

Moodenbaugh et al., *Phys. Rev. Lett* 58, 1885–1887 (1987), disclose superconductivity near 90 K. in multiphase samples with nominal composition $Lu_{1.8}Ba_{0.2}CuO_4$ prepared from dried $Lu_2O_3$, high-purity $BaCP_3$ ($BaCO_3$ presumably), and fully oxidized CuO. These powders were ground together in an agate mortar and then fired overnight in air at 1000° C. in Pt crucibles. This material was ground again, pelletized, and then fired at 1100° C. in air for 4–12 hours in Pt crucibles. Additional samples fired solely at 1000° C. and those fired at 1200° C. show no signs of superconductivity.

Hor et al., *Phys Rev. Lett.* 58, 1891–1894 (1987), disclose superconductivity in the 90 K. range in $ABa_2Cu_3O_{6+x}$ with A=La, Nd, Sm, Eu, Gd, Ho, Er, and Lu in addition to Y. The samples were synthesized by the solid-state reaction of appropriate amounts of sesquioxides of La, Nd, Sm, Eu, Gd, Ho, Er, and Lu, $BaCO_3$ and CuO in a manner similar to that described in Chu et al., *Phys. Rev. Lett.* 58, 405 (1987) and Chu et al., *Science* 235, 567 (1987).

Fibers and tapes of the recently discovered Y—Ba—Cu—oxide high-temperature superconductor would be quite useful in forming wires and other shapes. B. H. Hamling, U.S. Pat. No. 3,385,915, discloses a process for producing metal oxide fibers, textiles and shapes comprising the steps of (1) impregnating a preformed organic polymeric material with one or more compounds (preferably salts or hydrolysis products of salts) of metals selected from a group of 33 elements and (2) heating the impregnated organic material under controlled conditions (which prevent ignition of the material) and at least in part in the presence of an oxidizing gas (a) to convert the organic material to predominantly carbon and thereafter remove the carbon as a carbon-containing gas, and (b) oxidize the metal compounds to their respective metal oxides. Suitable organic polymeric materials include cellulosic materials. When the metal that will appear in the oxide has salts which are highly soluble in water, the impregnation step can be carried out by immersing the organic material in a concentrated solution of such salt. The metal oxides in the fibers, textiles and shapes are substantially amorphous.

B. H. Hamling, U.S. Pat. NO. 3,663,182, discloses metal oxide fabrics made by the process of U.S. Pat. No. 3,385,915. The metal compounds used in the impregnating solution are preferably salts or hydrolysis products of salts.

B. H. Hamling, U.S. Pat. No. 3,860,529, discloses zirconia fibers and textiles that are stabilized in the tetragonal form by small, carefully controlled amounts of oxides of Group IIIB of the Periodic Table. The stabilized tetragonal zirconia fibers and textiles are produced by the process disclosed in U.S. Pat. No. 3,385,915. Suitable precursor fibers or textiles include cellulosic materials. Suitable zirconium and Group IIIB metal compounds include the acetates.

Morton et al., U S. Pat. No. 3,992,498, disclose a process for preparing a refractory fiber, said process comprising fibrizing a composition having a viscosity greater than 1 poise, said composition comprising a solvent, a metal compound soluble in said solvent and an organic polymer soluble in said solvent and removing at least part of the solvent from the fiber so formed. Fibrizing may be carried out, for example, by centrifugal spinning, drawing, blowing or extrusion through a spinneret.

Frankel, U.S. Pat. No. 4,104,395, discloses a process for making mineral fibers which are much smaller in diameter than the organic fibers which are impregnated with the mineral compound by reducing the concentration of the impregnating solution. The process includes the following steps:

(a) washing and drying precursor organic fibers to drive moisture from them, (b) immersing the dried fibers in the impregnating solution and depositing the desired mineral compound in the fibers, (c) drying the fibers, (d) heating the fibers gradually to about 400° C. and maintaining that temperature for about 4 hours, and (e) further heating the mineral fibers to about 800° C. to complete calcination and then to about 1400° C. to sinter the mineral fibers.

SUMMARY OF THE INVENTION

This invention provides an improved process for preparing superconducting composition having the formula $MBa_2Cu_3O_x$ wherein M is selected from the group consisting of Y, Nd, Sm, Eu, Gd, Dy, Ho, Er, Tm, Yb, and Lu; x is from about 6.5 to about 7.0; said composition having a superconducting transition temperature of about 90 K.; said process consisting essentially (a) forming in acetic acid a mixture of $M(C_2H_3O_2)_3$, barium acetate and copper acetate in an atomic ratio of M:Ba:Cu of about 1:2:3; (b) heating the resulting mixture to boiling, and adding sufficient formic acid to dissolve any undissolved starting material while continuing to maintain boiling; (c) evaporating the solvent from the resulting solution to form a solid mass; (d) heating the resulting material in an oxygen-containing atmosphere at a temperature from about 850° C. to about 925° C. for a time sufficient to form $MBa_2Cu_3O_y$, where y is from about 6.0 to about 6.4; and (e) maintaining the $MBa_2Cu_3O_y$ in an oxygen-containing atmosphere while cooling for a time sufficient to obtain the desired product. The invention further provides a process for preparing a shaped article of a superconducting $MBa_2Cu_3O_x$ composition, said process consisting essentially of contacting an article of cellulose material with the solution from step (b) above, thereby impregnating the article with the solution; removing excess solution from and drying the impregnated article; heating the resulting impregnated article to the temperature prescribed in step (d) above to form $MBa_2Cu_3O_y$, said heating being conducted to meet specified conditions; and cooling the resulting article as described in step (e) above to obtain the desired product. The invention also provides the shaped article prepared by the processes of the invention.

DETAILED DESCRIPTION OF THE INVENTION

The process of the invention provides an improved process for preparing superconducting compositions having the formula $MBa_2Cu_3O_x$. M is selected from the group consisting of Y, Nd, Sm, Eu, Gd, Dy, Ho, Er, Tm, Yb and Lu, but is preferably Y. The parameter x is from about 6.5 to about 7.0, but is preferably from about 6.8 to about 7.0.

In the process of the invention a precursor solution is first prepared. The use of this solution assures a high degree of intimate mixing of the reactant cations relative to conventional solid state techniques and results in the preparation of a uniform single-phase superconducting $MBa_2Cu_3O_x$ composition. Two ways of using this solution are:

(1) the solvent is evaporated and the resulting solid material formed is heated to about 350° C. to about 700° C., preferably to about 400° C., to form a precursor powder which can be subsequently heated to a temperature from about 850° C. to about 925° C. to form $MBa_2Cu_3O_x$ upon cooling as prescribed herein, and (2) a cellulose article can be impregnated with the solution, and then the resulting impregnated article is heated a temperature from about 850° C. to about 925° C. to form $MBa_2Cu_3O_x$ upon cooling as prescribed herein.

The solution of M, Ba and Cu acetates can be formed by adding to acetic acid M, Ba and Cu acetates or the corresponding hydrates in amounts such that the atomic ratio of M:Ba:Cu is about 1:2:3. The resulting mixture is then heated to boiling, and sufficient formic acid is added to dissolve any undissolved starting material while continuing to boil the mixture. The formic acid can be added before the mixture is brought to boil, but is preferably added after boiling has begun. The ratio of the volume of formic acid used to the volume of acetic acid used is preferably from about 1:3 to about 1:10, and most preferably is about 1:5.

Preferably, the starting materials used in the process of the invention are of high purity. Less pure starting materials can be used; however, the product may then contain an amount of another phase material comparable to the amount of impurity in the starting materials. It is particularly important to avoid the presence of impurities containing iron and other transition, but non-rare earth, metals in the reactants.

When the solution is used to make a precursor powder, the solvent is boiled off and a solid material formed. Preferably, this solid material is heated at a temperature from about 350° C. to about 700° C., preferably at about 400° C., to form a precursor powder. The precursor powder is stable and easy to handle.

The precursor powder is then heated in an oxygen-containing atmosphere at a temperature from about 850° C. to about 925° C. for a time sufficient to form $MBa_2Cu_3O_y$, where y is from about 6.0 to about 6.4. Alternatively, prior to heating the precursor powder can be pressed into a disk, bar or other desired shape using conventional techniques. For heating, the precursor powder is placed in a non-reactive container such as an alumina or gold crucible. The oxygen-containing atmosphere can be air or oxygen gas, but air is preferred. In another embodiment of the invention, when the solvent is boiled off and the solid material formed, this solid material can be heated in air at a temperature from about 850° C. to about 925° C. for a time sufficient to form $MBa_2Cu_3O_y$.

The container with the precursor powder is placed in a furnace and brought to a temperature of from about 850° C. to about 925° C. It is the total time that the precursor powder is at temperatures in this range that is important. At a final temperature of 900° C., a time of ½ hour at this temperature is sufficient to produce, after cooling as prescribed herein, single-phase superconducting $MBa_2Cu_3O_x$. Alternatively, the container can be placed directly into an oven already heated to the final heating temperature. Longer heating times can be used.

At the end of the heating time, the furnace is turned off, and the resulting material is allowed to cool in an oxygen-containing atmosphere for a time sufficient to obtain the desired product. Preferably, the material is cooled to below about 100° C. (a time interval of about 8 hours) before the sample container is removed from the furnace. During the cooling step, the oxygen content of the material increases to give the desired $MBa_2Cu_3O_x$ product. The additional oxygen which enters into the crystalline lattice of the material during this cooling step to form the desired product does so by diffusion. The rate at which oxygen enters the lattice is determined by a complex function of time, temperature, oxygen content of the atmosphere, sample form, etc. Consequently, there are numerous combinations of these conditions that will result in the desired product. For example, the rate of oxygen uptake by the material at 500° C. in air is rapid, and the desired product can be obtained in less than an hour under these conditions when the sample is in the form of a loosely packed, fine particle powder. However, if the sample is in the form of larger particles, densely packed powders or shaped articles, the times required to obtain the desired product at 500° C. in air will increase. Well sintered, shaped articles will take longer to form the desired product than will more porous ones, and for larger, well sintered, shaped articles many hours may be required.

A convenient procedure for obtaining the desired product when the material is in the form of a powder or a small shaped object is to turn off the furnace in which the heating was conducted and to allow the material to cool in the furnace to a temperature approaching ambient temperature (about 22° C.) which typically requires a few hours. In the examples, cooling in the furnace to below about 100° C. was found to be sufficient. Increasing the partial pressure of oxygen in the atmosphere surrounding the sample during cooling increases the rate at which oxygen enters the lattice. If, in a particular experiment, the material is cooled in such a manner that the $MBa_2Cu_3O_x$ product is not obtained, the material can be heated to an intermediate temperature, such as 500° C., between ambient temperature and the final temperature used in the heating step and held at this temperature for a sufficient time to obtain the desired product. If the $MBa_2Cu_3O_x$ product is pressed into a desired shape and sintered at about 900° C. to about 950° C., the above cooling considerations would then apply to the resulting shaped article.

The product formed by the process of the invention is single-phase and has orthorhombic symmetry as determined by x-ray diffraction measurements.

The process of the invention provides a method for preparing a superconducting $MBa_2Cu_3O_x$ composition that does not require a special atmosphere during the heating step, subsequent grinding, reheating or annealing, extended heating times or refining of the product to separate the desired superconducting $MBa_2Cu_3O_x$ composition from other phases.

In another embodiment of the invention, the solution is used to make fibers, fabrics or other shaped forms of superconducting $MBa_2Cu_3O_x$ by impregnating cellulose articles of the desired shape with the solution. The term "cellulose articles" means articles whose chief ingredient is cellulose or one of its derivatives, e.g., regenerated cellulose (such as rayon), cotton, cellulosic papers and felts, wood pulp, etc. Impregnation is most easily accomplished by immersing the cellulose article in the boiling solution for a time sufficient to effect impregnation. The time of immersion will depend on the form of the cellulose article. Fibers and yarns will take less time than thicker cords or ropes or than woven fabrics. A few minutes have been found to be sufficient when cellulose yarn is used. Ten minutes have been found to be sufficient for fabrics made of cellulose fibers. Longer times can be used. The solution should be kept hot, for example, at reflux, to provide rapid impregnation during the immersion. The amount of impregnated material in the cellulose article after it is dried depends on the concentration of the solution. The greater this amount, the greater the amount of superconducting material in the final article. It is therefor preferable to use concentrated solutions for impregnation. The solution can be made more concentrated by evaporating some of the solvent, however, before immersing the cellulose article care must be taken to insure that no precipitates have formed.

Preferably, the cellulose article is swollen before impregnation, thereby enhancing the diffusion of the solution into the cellulose material. The cellulose material can be swelled by immersing the article in any suitable liquid, such as liquid ammonia, nitric acid or acetic acid, but liquid ammonia is preferred. The required time of immersion will depend on the form of the cellulose articles with longer times needed for ropes, cords and woven fabrics than for fibers and yarns. A few minutes have been found to be sufficient when cellulose yarn is used. Ten minutes have been found to be sufficient for fabrics made of cellulose fibers. After the cellulose article is removed from the ammonia, it is dipped into a polar organic solvent such as tetrahydrofuran to remove any excess ammonia. If the cellulose article is not swollen before being impregnated with the solution, some swelling will occur during the impregnation step as a result of the acetic acid present in the solution.

When the cellulose article is removed from the solution, excess solution is removed, for example, by blotting or centrifuging, and the cellulose article is dried by conventional techniques such as air drying.

After the impregnated cellulose article has dried, it is preferably heated to a temperature from about 75° C. to about 150° C. in air for about 1 to about 60 minutes. The cellulose article can then be flexed to reduce interfilament sticking. Flexing is especially desirable when the cellulose article is a skein of cellulose yarn. Such flexing can also be carried out after drying with similar benefit For heating, the impregnated cellulose article is placed in a non-reactive container, e.g., an alumina or gold crucible or tray. The container is placed in a furnace and brought to a temperature from about 850° C. to about 925° C. in an oxygen-containing atmosphere. The oxygen-containing atmosphere can be air or oxygen gas, but air is preferred. The cellulose article is heated under controlled conditions which avoid igniting or burning the cellulose and instead promote the carbonization of the cellulose and the removal of the carbon by oxidation. This can be accomplished by increasing the temperature of the cellulose article at a slow enough rate. Rates of increase of temperature of 10° C. per minute have been found to be sufficiently slow to heat yarns, but slower rates are preferred. A rate of increase of temperature of 1° C. per minute to 400° C. followed by a rate of increase of temperature of 10° C. per minute to the final heating temperature of about 875° C. to about 900° C. is preferred when heating fabrics. At a final heating temperature of 900° C., heating times of 1 hour are sufficient to produce single-phase superconducting fibers of $MBa_2Cu_3O_x$ after cooling as described hereinabove. Longer heating times can be used. At the end of the heating time, the furnace is turned off and allowed to cool as previously described herein.

The product formed is single-phase and has orthorhombic symmetry as determined by x-ray diffraction measurements.

The impregnation method of the invention can be used to prepare yarn of the superconducting $MBa_2Cu_3O_x$ which may then be imbibed in low melting metals or other materials to form wires. It can also be used to form other shapes of superconducting $MBa_2Cu_3O_x$ which may then be imbibed in metals, glass or polymer resins to provide additional strength and integrity.

As used herein the phrase "consisting essentially of" means that additional steps can be added to the process of the invention so long as such steps do not materially alter the basic and novel characteristics of the invention.

The invention is further illustrated by the following examples in which temperatures are in degrees Celsius unless otherwise indicated. Reagent grade chemicals were used to demonstrate that the invention results in single phase $MBa_2Cu_3O_x$ product. Four-probe resistance measurements were performed on the samples in the form of sintered bars or bundles of fibers. A Kiethly 220 dc current source was used for applying constant current through the samples, and a Kiethly 181 nanovoltmeter used to monitor the voltage drop across the samples. Superconductivity was also confirmed by observing magnetic flux exclusion, i.e., the Meissner effect.

EXAMPLE 1

$Y(C_2H_3O_2)_3.4H_2O$ (1.6905 g), 2.995 g of $Cu(C_2H_3O_2)_2.H_2O$ and 2.5543 g of $Ba(C_2H_3O_2)_2$ were combined and heated with 10 mL of acetic acid to reflux, and then 2 ml of formic acid was added. All solid material dissolved upon addition of the formic acid. The resulting solution was heated to boil off the solvent. The resulting residue was heated to 400° C. for 12 hours to form a brown solid material. The solid material was ground for 15 minutes in an agate mortar. The resulting powder was pressed into pellets, 10 mm in diameter and 1 to 2 mm thick, which were then placed in an alumina tray and heated in air in a furnace from ambient temperature to 900° C. at a rate of 10° C. per minute. The pellets were then heated at 900° C. in air for different heating times ranging from ½ hour to 10 hours. In each case, the furnace was turned off at the end of the heating time and the sample allowed to cool to a temperature of below 100° C. before it was removed from the furnace.

In each case, the $YBa_2Cu_3O_x$ product was black. Four-probe resistance measurements performed on bars cut from the pellets showed a superconducting transition above about 90 K. The pellets were crushed and an X-ray diffraction powder pattern was obtained. The indices of the observed reflections, the d-spacings and relative intensities are shown in Table I. The results indicate that the $YBa_2Cu_3O_x$ product has orthorhombic symmetry and no other phase was detected.

TABLE I

X-ray diffraction data for $YBa_2Cu_3O_x$

| hkl | d(nm) | Intensity* |
|---|---|---|
| 002 | 0.5812 | vw |
| 003 | 0.3875 | wm |
| 100 | 0.3819 | w |
| 012 | 0.3217 | w |
| 102 | 0.3196 | w |
| 013 | 0.2739 | s |
| 103 } 110 | 0.2722 | vs |
| 111 | 0.2651 | vw |
| 112 | 0.2468 | w |
| 005 | 0.2332 | m |
| 104 | 0.2320 | vw |
| 113 | 0.2232 | m |
| 020 } 006 | 0.1943 | m |
| 200 | 0.1912 | m |
| 115 | 0.1773 | w |
| 016 } 023 | 0.1736 | vw |
| 203 } 210 } 121 | 0.1713 | vw |
| 122 | 0.1666 | vvw |
| 123 } 116 | 0.1586 | ms |
| 213 | 0.1571 | m |

*Legend:
s — strong
m — moderate
w — weak
v — very

EXAMPLE 2

Ten mmole (3.39) of $Y(C_2H_3O_2)_3 \cdot 4H_2O$, 20 mmole (5.11 g) of $Ba(C_2H_3O_2)_2$, and 30 mmole (5.99 g) of $Cu(C_2H_3O_2)_2 \cdot H_2O$ were combined and dissolved by first heating in 20 ml of acetic acid to reflux and then adding 4.5 ml of formic acid. All solid material dissolved upon addition of the formic acid. This resulting solution was kept at reflux by simmering on a hot plate.

Several skeins of rayon tire-cord yarn were combined and dipped into liquid ammonia at −33° C. for about one minute. The yarn was then removed and washed by dipping in tetrahydrofuran two times. The resulting swollen yarn was then immersed in the Y—Ba—Cu—acetate solution for 3 minutes and removed. The excess solution was removed by wiping thoroughly with a paper towel. The yarn was allowed to dry in air overnight. Then the impregnated yarn was heated to 150° C. and flexed to reduce interfilament sticking The yarn was placed in an alumina tray and then heated in air in a furnace at a rate of 10° C. per minute from room temperature to 800° C., held at 800° C. for 15 minutes, then heated to 900° C. at a rate of 5° C. per minute and held at 900° C. for 60 minutes. The furnace was turned off and allowed to cool to a temperature below 100° C. before the yarn was removed. The resulting $YBa_2Cu_3O_x$ product yarn was black.

An X-ray diffraction pattern of powder obtained by grinding the yarn was, within experimental error, practically identical to that shown in Table I and no other phases were detected.

Another skein of the same rayon tire-cord yarn was immersed in liquid ammonia for 1 minute, rinsed in tetrahydrofuran and in warm acetic acid for 30 sec. and then immersed in the Y—Ba—Cu acetate solution for 30 sec. After drying, the yarn was heated in air in a furnace at a rate of 10° C. per minute from ambient temperature to 800° C., held at 800° C. for 15 min., then heated to 900° C. at a rate of 5° C. per minute and held at 900° C. for 60 minutes. The furnace was then turned off and allowed to cool to a temperature below 100° C. before the yarn was removed. The resulting $YBa_2Cu_3O_x$ product yarn was black.

When placed in a pool of liquid nitrogen the sample yarn was repulsed by a magnet thereby exhibiting the Meissner effect and indicating that the sample was superconducting.

EXAMPLE 3

A Y—BA—Cu—acetate solution was prepared using a procedure similar to that described in Example 2. Another skein of the same type of rayon tire-cord yarn used in Example 2 was immersed and simmered in the Y—Ba—Cu—acetate solution for about 45 min., rinsed with acetone and blotted dry.

The resulting impregnated yarn was heated in air in a furnace at a rate of 10° C. per minute from ambient temperature to 800° C., held at 800° C. for 30 minutes, heated further to 900° C. at a rate of 5° C. per minute and held at 900° C. for 10 hours. The furnace was turned off and allowed to cool to a temperature below 100° C. before the resulting product was removed. The resulting $YBa_2Cu_3O_x$ product yarn was black.

Four probe resistivity measurements made on a piece of product yarn showed the yarn to be superconducting with a transition temperature of about 90 K.

EXAMPLE 4

A lightweight woven rayon fabric (plain weave, basis wt.=100 g/m²) 2.5 cm (1 in.) wide by 110 cm (45 in.) long was placed in a trap fitted with a dry ice-acetone condenser. Ammonia was condensed into the trap and allowed to swell the fabric for 10 minutes. The fabric was removed, rinsed twice in tetrahydrofuran, and twice in a 5:1 by volume mixture of acetic acid:formic acid.

The resulting swollen fabric was then immersed in a solution of 16.91 g of $Y(C_2H_3O_2)_3 \cdot 4H_2O$, 25.53 g of $Ba(c_2H_3O_2)_2$, and 29.95 g of $Cu(C_2H_3O_2)_2 \cdot H_2O$ dissolved in 100 ml acetic acid and 20 ml formic acid. The solution was maintained at boil. After 10 minutes the fabric was removed and excess solution was removed by centrifugation.

After drying at ambient temperature, the resulting impregnated fabric was heated to 150° C. for 15 minutes. The fabric remained flexible and could be formed into various shapes. A major portion of the impregnated fabric was then heated in air in a furnace at a rate of 1° C. per minute to 400° C. and then at a rate of 10° C. per minute to 880° C. The fabric was held at a temperature of 880° C. for 3 hrs. The furnace was then turned off and allowed to cool slowly to a temperature of below 100°

C. before the resulting product was removed from the furnace.

Another rayon fabric in the form of a velvet (basis wt.=190 g/m$^2$) was treated using a procedure similar to that described in the preceding three paragraphs. The resulting pieces of black fabric were brittle but could be handled without damage.

Pieces of both fabrics exhibited the Meissner effect while in a pool of liquid nitrogen, thereby indicating superconductivity.

X-ray diffraction patterns of powders obtained by grinding up the fabrics were, for both fabrics, within experimental error, practically identical to that shown in Table I and no other phases were detected.

The invention being claimed is:

1. An improved process for preparing a shaped article of a superconducting composition having the formula MBa$_2$Cu$_3$O$_x$ wherein M is selected from the group consisting of Y, Nd, Sm, Eu, Gd, Dy, Ho, Er, Tm, Yb and Lu;

x is from about 6.5 to about 7.0;

said composition having a superconducting transition temperature of about 90 K.;

said process consisting essentially of (a) forming in acetic acid a mixture of M(C$_2$H$_3$O$_2$)$_3$, barium acetate and copper acetate in an atomic ratio of M:Ba:Cu of about 1:2:3;

(b) heating the resulting mixture to boiling, and adding sufficient formic acid to dissolve any undissolved starting material while continuing to boil the solution;

(c) contacting an article of cellulose material with the solution from step (b), thereby impregnating the article with the solution, said article having the shape desired;

(d) removing excess solution from the resulting impregnated article of cellulose material and drying the impregnated article;

(e) heating the impregnated article of cellulose material to a temperature from about 850° C. to about 925° C. in an oxygen-containing atmosphere for a time sufficient to form MBa$_2$Cu$_3$O$_y$, where y is from about 6.0 to about 6.4, said heating effecting carbonization of the cellulose material and oxidization of carbon without ignition; and (f) maintaining the resulting article in an oxygen-containing atmosphere while cooling for a time sufficient to obtained the desired product.

2. A process according to claim 1 wherein the article of cellulose material is, prior to step (c), contacted with a suitable liquid to swell the article.

3. A process according to claim 2 wherein the liquid used for swelling is liquid ammonia.

4. A process according to claim 3 wherein x is from about 6.8 to about 7.0.

5. A process according to claim 4 wherein the impregnated article is heated to a temperature from about 875° C. to about 900° C. in step (e).

6. A process according to claim 5 wherein the article of cellulose material is a fiber, cord or fabric.

7. A process according to claim 6 wherein M is Y.

8. A process according to claim 7 wherein the impregnated article of cellulose material is heated at a temperature of from about 75° C. to about 150° C. prior to step (e).

* * * * *